United States Patent [19]

Heeren

[11] 4,285,117
[45] Aug. 25, 1981

[54] METHOD OF MANUFACTURING A DEVICE IN A SILICON WAFER

[75] Inventor: Richard H. Heeren, Palatine, Ill.

[73] Assignee: Teletype Corporation, Skokie, Ill.

[21] Appl. No.: 73,042

[22] Filed: Sep. 6, 1979

[51] Int. Cl.³ .................................. H01L 21/285
[52] U.S. Cl. .............................. 29/571; 29/577 C; 148/187; 357/23; 357/51; 357/91
[58] Field of Search .............. 29/571, 577 C; 148/187; 357/51, 23, 91

[56] References Cited

U.S. PATENT DOCUMENTS

| | | | |
|---|---|---|---|
| 3,764,413 | 10/1973 | Kakizaki et al. | 29/571 X |
| 4,016,587 | 4/1977 | DeLaMoneda | 357/23 |
| 4,041,518 | 8/1977 | Shimizu et al. | 357/42 X |
| 4,110,776 | 8/1978 | Rao et al. | 357/23 |
| 4,177,096 | 12/1979 | Okumura et al. | 29/571 |
| 4,178,674 | 12/1979 | Liu et al. | 29/571 |
| 4,208,781 | 6/1980 | Rao et al. | 29/576 B |
| 4,209,716 | 6/1980 | Raymond | 357/23 X |
| 4,214,917 | 7/1980 | Clark et al. | 29/571 X |
| 4,219,925 | 9/1980 | Heeren | 29/571 X |
| 4,234,889 | 11/1980 | Raymond et al. | 357/23 X |

OTHER PUBLICATIONS

Nishimatsu et al., *Japanese J. of Applied Physics*, vol. 16, (1977), Suppl. 16-1, pp. 179-183.

Middelhoek et al., IEEE Transactions on Electron Devices, May 1976, pp. 523-525.

*Primary Examiner*—G. Ozaki
*Attorney, Agent, or Firm*—W. K. Serp; J. C. Albrecht

[57] ABSTRACT

Portions of a doped silicon body 22 are covered with an oxide dielectric 26 leaving the active areas 25 on the silicon body exposed. A polysilicon layer 28 having a predetermined resistance characteristic is formed over the entire wafer surface followed by a layer of silicon nitride 30. Selected portions of the silicon nitride layer 30 are removed with the nitride remaining over the source/drain regions 36 of the active area and the locations of first level conductor runs 32. The exposed polysilicon 28 is converted to an oxide and the silicon nitride 30, covering the source/drain regions 36 and the first level conductor runs, is removed. The exposed polysilicon is doped forming source/drain diffusions 46 and first level conductors 32. An oxide dielectric 52 is formed over the wafer 20 and removed from the gate areas 56 followed by the formation of a thin gate dielectric 54. Finally the oxide 52 is removed at the interconnect work sites and second level conductors 58, 60 are formed. If desired, resistors are formed by allowing the nitride masking layer 30 to remain over selected portions of the polysilicon during the doping of the source/drain areas and first level conductors.

5 Claims, 13 Drawing Figures

METHOD OF MANUFACTURING A DEVICE IN A SILICON WAFER

TECHNICAL FIELD

THis invention relates to a method of manufacture of an insulated gate field-effect transistor (IGFET) and its associated load resistor and to the structure of such a device.

BACKGROUND ART

Integrated circuits which utilize IGFET devices are generally rated on the basis of the electrical performance of the device. Such rating parameters include the frequency response, electrical breakdown characteristics and the economy of wafer surface area. All of these are dependent on the method of formation of the device in the wafer.

One feature which limits the frequency response and circuit density is the depth of the source/drain diffusions. In previous arrangements, second level conductor interconnects were made to these diffusions requiring that the diffusions be of sufficient depth to prevent puncture to the underlying doped silicon body. As the source/drain diffusion increased in depth in correspondingly increased in width thus increasing the surface area occupied by the transistor. Additionally, an increase in the size of the source/drain diffusions increased the interelectrode capacitances and produced a corresponding decrease in the maximum frequency of the device. In many prior arrangements, conductive first level conductor runs are placed in the doped silicon body which results in a relatively high first level conductor to substrate capacitance. Further, when metalized second level conductor runs are placed, there is a chance of puncture and possible shorting to the underlying doped silicon body at the point of connection between first and second level conductor runs. The instant disclosure eliminates these problems by providing improved isolation between the first level conductors and the substrate and between the first and second level conductors. Additionally, the photoshaping operation defining the second level conductors does not require critical mask alignment on the wafer as the prior arrangements.

SUMMARY OF THE INVENTION

The disclosed method utilizes a doped silicon i.e., semiconductor body of a first conductivity type having formed on a portion of the body of a first conductivity type having formed on a portion of the body an oxide dielectric material whereat transistors are not to be formed. The disclosed method is characterized by the following steps:

A. form a polysilicon layer having a predetermined resistance characteristic over the entire surface of the wafer;

B. form a silicon nitride masking layer over the polysilicon layer;

C. remove selected portions of the silicon nitride layer so that the silicon nitride layer will only remain over the source/drain regions of the active areas and the first level conductor runs;

D. convert the exposed polysilicon to an oxide dielectric;

E. remove the silicon nitride covering the source/drain regions and first level conductor runs;

F. dope the exposed polysilicon to a second conductivity type thus increasing the conductivity of the exposed polysilicon and forming source/drain regions in the semiconductor body of a second conductivity type;

G. form an oxide dielectric coating over the entire surface of the wafer;

H. remove the oxide dielectric coating from the gate areas of the transistor body being formed;

I. form a thin gate oxide over the entire surface of the wafer;

J. remove the oxide dielectric coating from the interconnect work sites of the first level conductor runs; and K. place electrical conductors at selected locations on the wafer surface to provide electrical contact with the gate and interconnect work sites of the first level conductive runs.

As an option, a silicon nitride layer 50 is formed over the entire surface of the wafer after step F to form an etchant stop to relax the process control of step J. During Step I, the nitride layer is removed from the gate areas of the transistor and after Step J, the nitride layer is removed from the interconnect work sites of the first level conductor runs.

As a further option in Step C, the silicon nitride layer 30 is allowed to remain over those polysilicon areas 34 which are to serve as resistive elements.

THE DRAWINGS

FIGS. 1 through 11, inclusive, illustrate selected steps during the fabrication of an insulated gate field-effect transistor (IGFET) in accordance with this invention.

DETAILED DESCRIPTION

Figure 1:
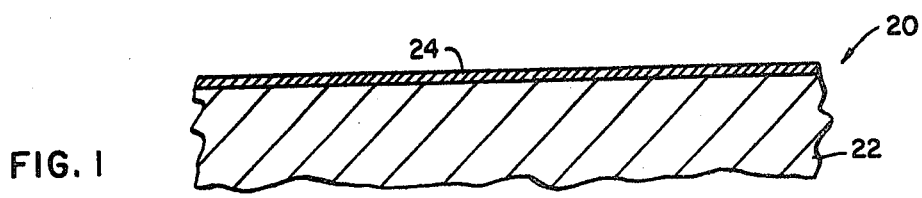
Figure 2:
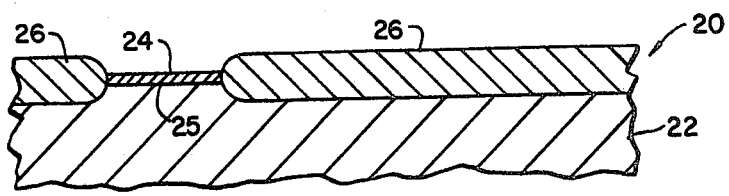
Figure 3:
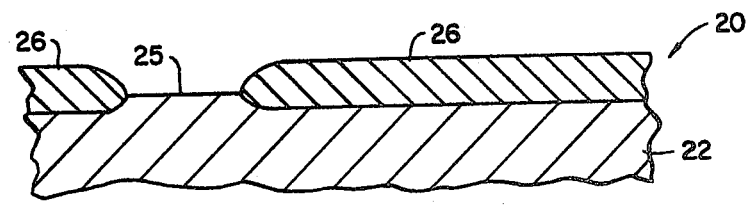
Figure 3A:
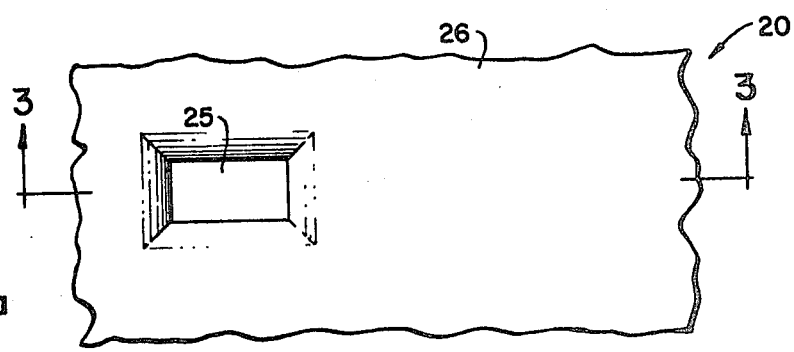
Figure 4:
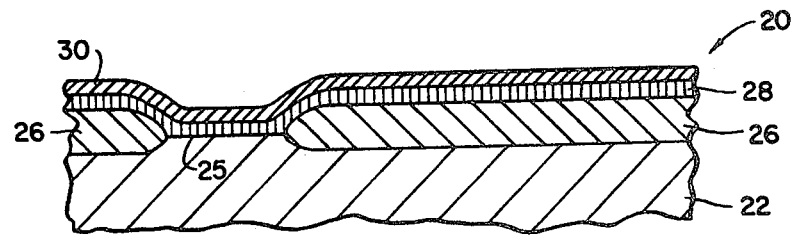
Figure 5:
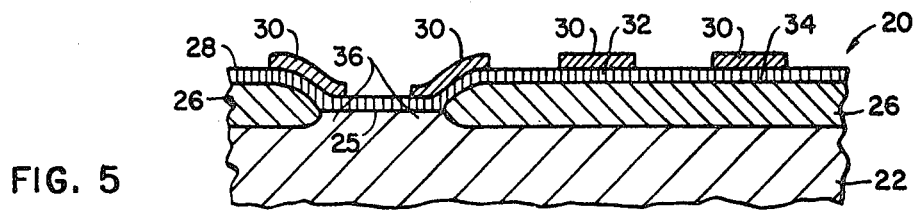
Figure 6:
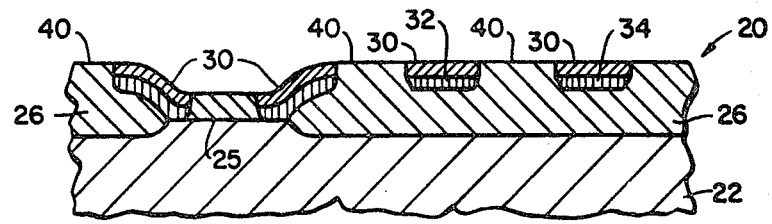

The method described utilizes a wafer 20 having a P-type silicon body 22 doped with N-type impurities as the dopant at the source/drain areas, that is, N-channel technology. However, it will be appreciated that the method may also be used with P-channel technology. As a first operational step, the surface of the semiconductor body 22 is covered with a masking medium in the form of a silicon nitride ($Si_3N_4$) layer 24 which serves as an oxidation barrier. The wafer 20 is covered with a photoresist material and a lithographic mask defines the active areas on the wafer 20. The nitride layer in the field areas (the non-active areas of the wafer) is removed and the wafer 20 is exposed to an oxygen atmosphere under elevated temperature conditions which causes a field oxide growth 26 over the exposed surface of the wafer 20. The silicon nitride 24 acts as an oxide barrier over the active area 25. This oxide layer 26 serves to insulate first level conductor runs from the semiconductor body 22 as will subsequently be more fully appreciated. As illustrated in FIG. 3 and 3a, the oxide insulating layer 26 covers the entire surface of the wafer 20 with the exception of the active area 25 i.e., a transistor location. Since the oxide growth 26 penetrates the semiconductor body 22, discontinuities between the surface of the oxide 26 and the semiconductor body 22 are minimized. In the next operation, the surface of the wafer 20 is coated with a polycrystalline silicon layer 28 having a predetermined resistive value. The resistance characteristic of the polysilicon layer 28 is determined by the value of the load resistors to be formed in the device. Alternatively, polycrystalline silicon may be deposited and conductivity modifiers simultaneously or subsequently diffused therein to make the layer conductive to the desired degree. As shown in FIG. 4, placed over the polysilicon layer 28 is a silicon nitride (Si3N4) masking layer 30 which serves as an etching barrier in subsequent operations. A second photoshaping operation utilizes a second mask defining the first level conductor runs 32, the resistor locations 34 and the source/drain regions 36. After the masking layer 30 is selectively etched, the wafer 20 displays the configuration of FIG. 5. It will be appreciated that the alignment of the first and second masks of FIGS. 2 and 5 is non-critical.

In a following operation, the wafer 20 is exposed to an oxygen atmosphere under elevated temperature conditions causing the exposed polysilicon 28 to convert to an oxide dielectric as at 40 with the nitride masking layer 30 serving as an oxidation barrier. A feature of this process is that the polysilicon 28 is removed by oxidation rather than a selective etching process as in prior arrangements.

Figure 7:
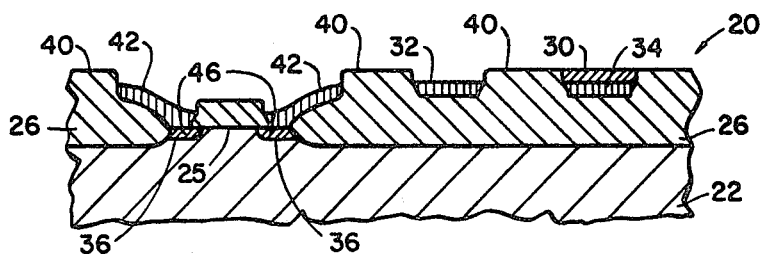
Figure 7A:
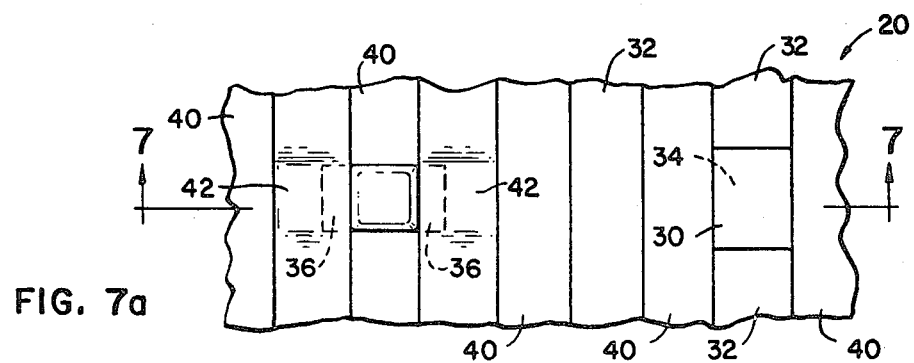

A third photoshaping operation includes the application of a resistor mask which protects those portions 34 of the masking layer 30 whereat load resistors 34 are desired. The wafer 20 is photoshaped to remove the unprotected masking layer 30. The wafer 20 is elevated in temperature and exposed to a gas environment containing arsenic, phosphorus or any other suitable dopant. Alternatively, an ion implant process may be employed. The field oxide 40 serves as a diffusant barrier below the first level conductor 32 and the diffusant penetrates through the polysilicon 42 at the source/drain regions 36 providing shallow souce/drain diffusions 46 in the semiconductor body. This feature results in a reduction in the size of the diffusions 46 and a corresponding reduction in the source/drain to semiconductor body capacitance. This step is controlled to keep the source/drain diffusions 46 relatively shallow. With many prior methods, the diffusions are made considerably deeper since the interconnects to the first level conductors are made over the source/drain diffusions and possible penetration to the semiconductor body must be avoided. The portion of the polysilicon 34 which forms the load resistor and underlays the silicon nitride layer 30 (FIG. 7) retains its high resistance characteristic. The resistive element is in the form of an elongated strip of polysilicon 34 having high resistance characteristics and extends over the oxide 26. The exposed, diffused polysilicon 32 becomes highly conductive and serves as first level conductor runs.

Figure 8:
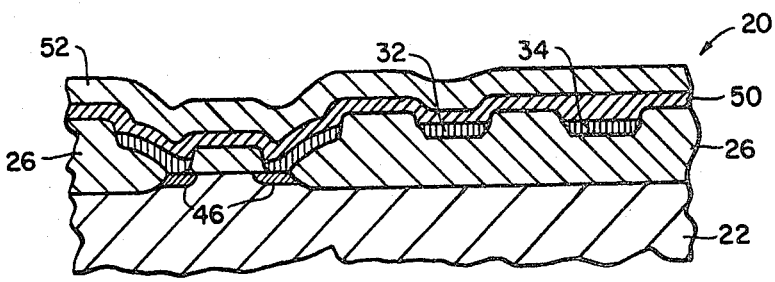

In the following operation (FIG. 8), the wafer 20 is preferably coated with a silicon nitride layer 50 which is used as an etchant barrier in the following steps and is an optional feature of the illustrated method. Placed upon the silicon nitride layer 50 is a coating of silicon dioxide 52 which insulates the source/drain diffusions 46 and the first level conductor 32 from the second level conductors formed in a subsequent step.

Figure 9:
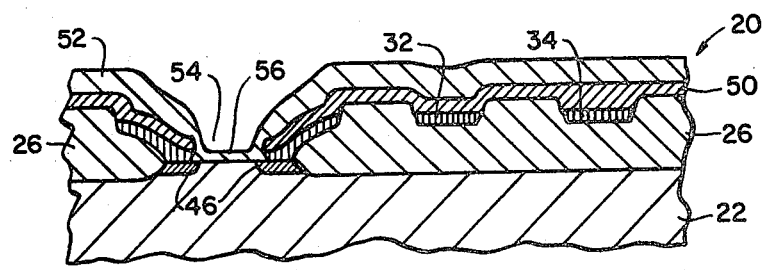
Figure 10:
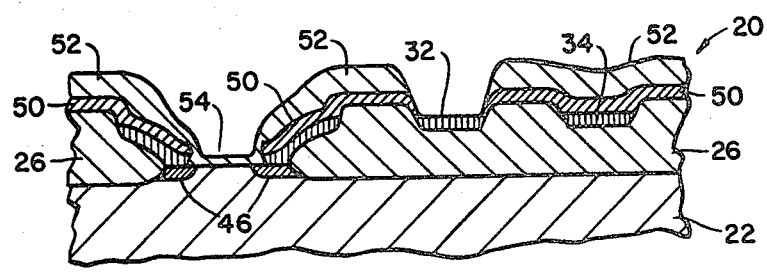
Figure 11:
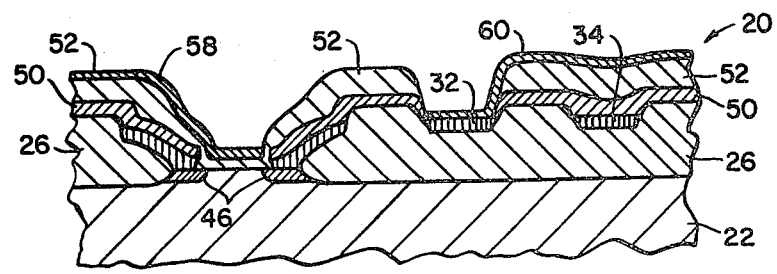

A fourth photoshaping operation, using a fourth mask defining a gate area 54, removes the oxide 52 and nitride masking layers 50 from the gate area 54. The wafer 20 is thereafter coated with thin gate oxide 56 (FIG. 9). It will be appreciated that the nitride layer 50 prevents etching around the edges of the conductor 32 which may physically weaken the structure. The first three masks applied in FIGS. 2, 5 and 7 did not require critical alignment; however, placement of the fourth mask defining the gate area 58 (FIG. 9) is relatively critical to assure that the gate will be accurately positioned with respect to the source/drain diffusion 46.

A fifth mask, which does not require critical alignment, is applied to the wafer 20 and the wafer 20 is photoshaped to remove the oxide 52 and silicon nitride layer 50 overlaing those areas of the conductive polysilicon first level conductor runs 32 whereat interconnect to second level conductors formed in the following operation. As a final step, the wafer 20 is covered with a conductive layer such as aluminum or conductive polysilicon. The conductive layer is photoshaped to define the second level interconnect runs 58 and 60.

Although this invention has been particularly shown and described with reference to a preferred implementation thereof, it should be understood that various changes in form and detail may be made without departing from the spirit and scope of the invention.

What is claimed is:

1. A method of manufacturing devices in a semiconductor wafer 20 of a first conductivity type having formed on a portion of the body 22 an oxide dielectric 26 exposing active areas of the semiconductor body 22 whereat transistors are to be formed, characterized by:
   A. forming a polysilicon layer 28 having a predetermined resistance characteristic over the entire surface of the wafer 20;
   B. forming a silicon nitride masking layer 30 over the polysilicon layer 28;
   C. removing selected portions of the silicon nitride layer so that the silicon nitride layer will only remain over the source/drain regions 36 of the active areas and the locations of first level conductor runs 32;
   D. converting the exposed polysilicon 28 to an oxide dielectric;
   E. removing the silicon nitride covering the source/drain regions 36 and first level conductor runs 32;
   F. doping the exposed polysilicon to a second conductivity type thus increasing the conductivity of the exposed polysilicon and forming source/drain regions 46 in the semiconductor body of a second conductivity type;
   G. forming an oxide dielectric coating 52 over the entire surface of the wafer;
   H. removing the oxide dielectric coating from the gate areas 54 of the transistor being formed;
   I. forming a thin gate oxide 56 over the active surface of the wafer 20;
   J. removing the oxide dielectric coating from the interconnect work sites of the first level conductor runs 32; and
   K. placing electrical conductors 58 at selected locations on the wafer surface to provide electrical contact with the gate oxide 56 and contact sites of the first level conductive runs 32.

2. The method of claim 1 which is further characterized by:
   L. forming a silicion nitride layer 50 over the entire surface of the wafer 20 after Step F;
   M. removing the nitride layer 50 from the gate areas 54 of the transistor being formed during Step I; and
   N. removing the nitride layer 50 from the interconnect work sites of the first level conductor runs 32 after Step J.

3. The method of claim 2 which is further characterized by:

O. in Step C allowing the silicon nitride layer 30 to remain over those polysilicon areas 34 which are to serve as resistive elements.

4. The method of claim 1 which is further characterized by:

P. in Step C allowing the silicon nitride layer 30 to remain over those polysilicon areas 34 which are to serve as resistive elements.

5. The method of claim 4 which is further characterized by:

Q. forming a nitride layer 50 over the entire surface of the wafer 20 after Step F;

R. removing the nitride layer 50 from the gate areas 54 of the transistor being formed during Step I; and S. removing the nitride layer 50 from the interconnect work sites of the first level conductor runs after Step J.

* * * * *